(12) United States Patent
Feger et al.

(10) Patent No.: US 8,636,931 B2
(45) Date of Patent: Jan. 28, 2014

(54) VACUUM EXTRUSION METHOD OF MANUFACTURING A THERMAL PASTE

(75) Inventors: Claudius Feger, Poughkeepsie, NY (US); Ijeoma M. Nnebe, Ossining, NY (US); Maurice McGlashan-Powell, Mount Vernon, NY (US)

(73) Assignee: International Business Machines Corporation, Armonk, NY (US)

( * ) Notice: Subject to any disclaimer, the term of this patent is extended or adjusted under 35 U.S.C. 154(b) by 681 days.

(21) Appl. No.: 11/750,559

(22) Filed: May 18, 2007

(65) Prior Publication Data
US 2008/0284052 A1 Nov. 20, 2008

(51) Int. Cl.
*B29C 47/76* (2006.01)
(52) U.S. Cl.
USPC .................. 264/101; 264/176.1; 264/211.21; 264/211.23

(58) Field of Classification Search
None
See application file for complete search history.

(56) References Cited

U.S. PATENT DOCUMENTS 6,264,710 B1 * 7/2001 Erickson .......................... 51/309
6,365,710 B1 * 4/2002 Wang et al. ................... 528/480

* cited by examiner

*Primary Examiner* — Monica Huson
(74) *Attorney, Agent, or Firm* — Novak Druce Connolly Bove + Quigg LLP; Daniel P. Morris, Esq.

(57) ABSTRACT

A method of manufacturing a thermal paste, in which the method includes feeding the thermal paste into a chamber of an extruder; mixing the thermal paste at elevated temperatures; de-airing the thermal paste; and extruding the thermal paste out of the chamber through a die as a pre-form or into a cartridge, such that air channels and pseudo-grain boundaries are prevented from forming in the thermal paste.

23 Claims, 5 Drawing Sheets

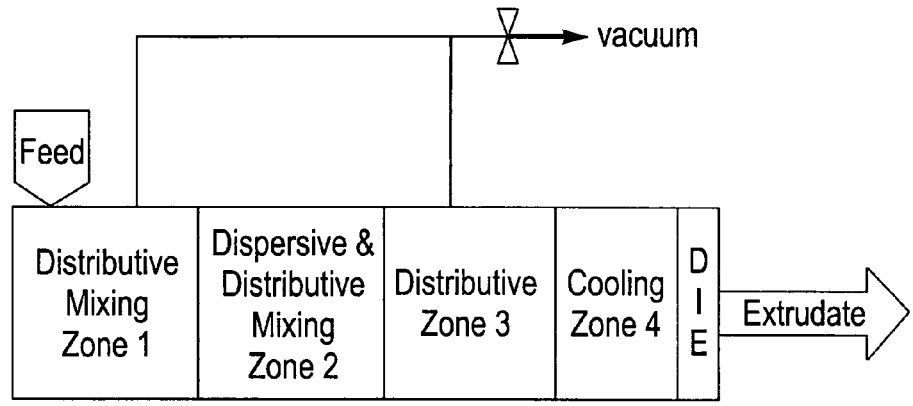
FIG. 7A
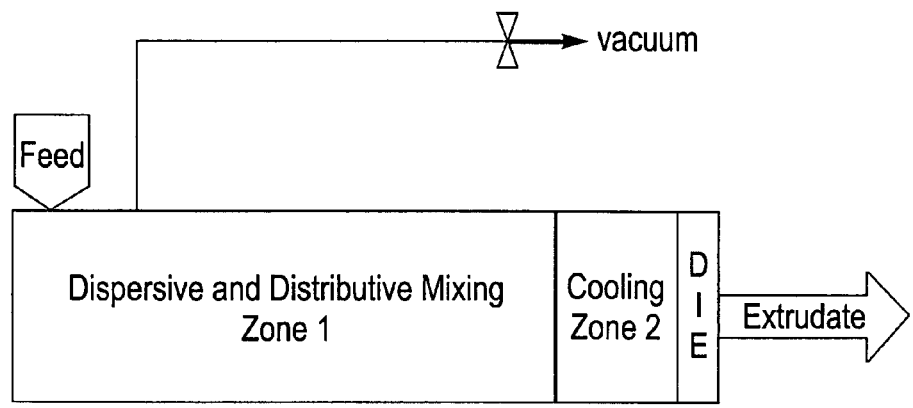
FIG. 7B
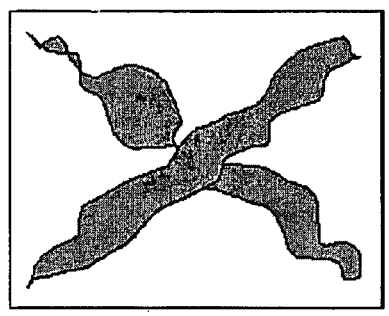 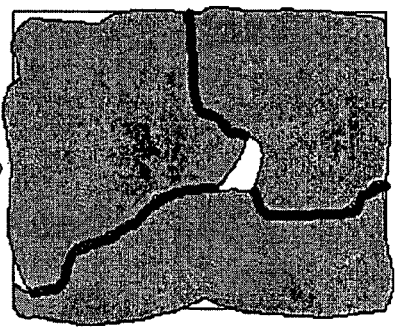
FIG. 8A        FIG. 8B

VACUUM EXTRUSION METHOD OF MANUFACTURING A THERMAL PASTE

BACKGROUND

1. Technical Field

The disclosure relates to methods for manufacturing thermal pastes, especially for flip chip microelectronic packages. In particular, the disclosure relates to a vacuum extrusion method of manufacturing a thermal paste, in which the method include feeding the thermal paste into a chamber of an extruder, mixing the thermal paste at elevated temperatures, de-airing the thermal paste, and extruding the thermal paste out of the chamber through a die as a pre-form or into a cartridge, such that air channels and pseudo-grain boundaries are prevented from forming in the thermal paste. Such prevention results in the superior performance and reliability of the thermal paste during thermal/mechanical stressing.

2. Discussion of the Background

Thermal interface materials (TIMs) are extensively used in microelectronic packaging technology, such as flip chip packaging. In particular, TIMs facilitate the heat transport from the chip to the environment and accommodate the stresses that arise between the silicon die and heat spreader and/or cooling unit, as a consequence of the temperature differential between the parts and the different thermal expansion coefficients of the materials involved.

TIMs are typically highly filled composite materials consisting of metal or metal oxide particles, having a diameter of about 0.1 to about 100 microns, and an organic binder. One common type of TIM is a thermal paste. Pastes have the advantage of achieving intimate contact between the TIM and confining interfaces, and enable small chip to cooling unit gaps called the "bondline." The smaller the bondline, i.e., the TIM thickness, the lower the thermal resistance, since in general the thermal conductivity of the TIM is the lowest of all materials involved. However, with decreasing bondline thickness, it is difficult for the paste to survive unchanged with the large temperature changes arising during chip operation and CPU power on/off. These temperature changes lead to thermal expansion/contraction of the confining interfaces (i.e. the die and spreader/hat) which translate into mechanical stresses. A good paste is expected to facilitate the thermal dimensional changes of all rigid parts in the cooling stack without degradation of its thermal performance.

Methods have been developed to analyze the behavior of thermal pastes during thermal/mechanical stressing (see Feger et al., IBM Journal of Research and Development, vol. 49, p. 699 (2005)), and several degradation mechanisms have been characterized, including growth and coalescence of entrapped air in the paste, paste detachment from one or both of the confining interfaces, bulk paste slip off the die, and air channel development in the paste. All degradation mechanisms significantly impact the efficiency of the paste in conducting heat away from the chip, but air expansion with coalescence and air channel development are the most severe and most common failure modes observed in the field.

Recently, it has been shown that air channels originate from the displacement of the liquid binder in channels that arise along "pseudo-grain boundaries" in the paste. "Pseudo-grain boundaries" are poorly mixed areas in the paste and can arise, as can air entrapments, either during the paste formulation process due to insufficient mixing or during the dispense and assembly process.

Current mixing protocols for paste formulation are batch processes in which distributive mixing and high-shear processing (for deglomeration) are separated into several steps. Such batch processes afford many opportunities for air entrapment and pseudo-grain boundary formation. During the production of paste pre-forms, as generally described in U.S. Pat. No. 6,444,496, pseudo-grain boundaries and air can be introduced. Further, air and pseudo-grain boundaries can be introduced if the paste is dispensed from a cartridge over the chip area in patterns that can lead to air inclusions and/or grain boundary formation.

In view of the foregoing, there remains a need for a method of manufacturing thermal pastes and their pre-forms which eliminates air inclusions and pseudo-grain boundaries therein, which results in TIMs with superior performance and reliability during thermal/mechanical stressing.

SUMMARY

Accordingly, the following embodiments provide for the minimization of air inclusions and/or pseudo-grain boundary formation during methods of manufacturing of TIMs, such as thermal pastes. In particular, the disclosure provides an extrusion-based manufacturing method that minimizes the air and grain boundary inclusion in the final a thermal paste. Extrusion generally has been used extensively in the plastics, explosives, rocket fuel and food industry, but has not been applied to thermal pastes which are granular materials of very high solids loading, i.e., greater than 65% v/v solids used in the microelectronics industry.

One embodiment provides a method of manufacturing a thermal paste, the method comprising:
  feeding the thermal paste into a chamber of an extruder;
  mixing the thermal paste;
  de-airing the thermal paste; and
  extruding the thermal paste out of the chamber through a die as a pre-form or into a cartridge,
  wherein air channels and pseudo-grain boundaries are prevented from forming in the thermal paste.

Another embodiment provides for a method of manufacturing a thermal paste, the method comprising:
  feeding the thermal paste into a chamber of an extruder;
  heating the thermal paste to a temperature from about 40° C. to about 150° C. in one or more zones of a chamber of an extruder;
  dispersive mixing the thermal paste while applying vacuum in a first zone of the chamber;
  dispersive and distributive mixing the thermal paste in a second zone of the chamber;
  distributive mixing the thermal paste in a third zone of the chamber;
  cooling the thermal paste in a fourth zone of the chamber to a temperature from about 0° C. to about 25° C.;
  extruding the thermal paste out of the extruder through a die as a pre-form or into a cartridge, wherein air channels and pseudo-grain boundaries are prevented from forming in the thermal paste.

Another embodiment provides for a method of manufacturing a thermal paste, the method comprising:
  feeding the thermal paste into a chamber of an extruder;
  heating the thermal paste to a temperature from about 40° C. to about 150° C. in one or more zones of the chamber;
  dispersive and distributive mixing the thermal paste while applying vacuum in a first zone of the chamber;
  cooling the thermal paste in a second zone of the chamber to a temperature from about 0° C. to about 25° C.;
  extruding the thermal paste out of the extruder through a die as a pre-form or into a cartridge,
  wherein air channels and pseudo-grain boundaries are prevented from forming in the thermal paste.

Further embodiments provide the use of single or multi-screw extrusion for the combined mixing, de-airing, and pre-form fabrication of the thermal pastes. For instance, raw materials may be fed separately or as a premixed composite into an extruder, in which the components undergo combined distributive and dispersive mixing for fine dispersion and deglomeration. Extrusion-based mixing is conducted at an optimal temperature from about 40° C. to about 150° C. where the mix zone can be at one or more temperatures within this range, and vacuum of a preferred pressure from about 0 to about 30 Hg may be applied either throughout the entire chamber or at specific zones in the extruder for adequate air removal from the mixture. The composite is then cooled to a temperature from about 0° C. to about 25° C. and extruded out of the die either in a desirable shape and thickness of a pre-form or into a cartridge.

Additionally, the disclosure provides that the combination of shear and elongational flow, achievable with the design selection of extrusion screw elements, as shown in U.S. Pat. No. 5,932,159, is highly suited to the mixing of thermal pastes, where dispersion can be challenging and inconsistent using batch step processes due to the high solids loading and varying particle size distribution.

The above-embodiments highlight certain aspects of the methods of manufacturing thermal pastes. However, additional embodiments are found in the following description of the drawings and detailed description.

BRIEF DESCRIPTION OF THE DRAWINGS

FIGS. 7A and 7B illustrate a flow diagrams of potential methods of de-airing the thermal paste during an extrusion formulation process.

FIGS. 8A and 8B illustrate a dispense pattern used for tube dispensed thermal pastes that can result in incomplete spreading resulting in voids or grain boundaries.

BEST AND VARIOUS MODES FOR CARRYING OUT DISCLOSURE

A more complete appreciation of the disclosure and many of the attendant advantages will be readily obtained, as the same becomes better understood by reference to the following detailed description when considered in connection with the accompanying drawings.

Figure 1A:
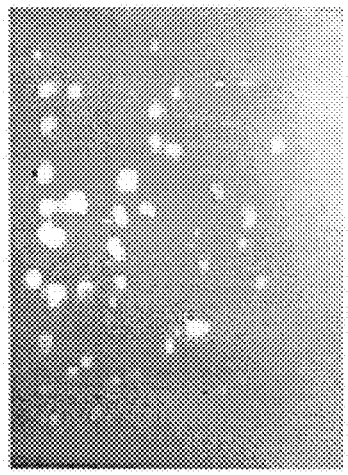
FIGS. 1A and 1B show IR images of the degradation of an exemplary thermal paste via (a) growth and coalescence of entrapped air; and (b) development of air-filled channels.
Figure 1B:
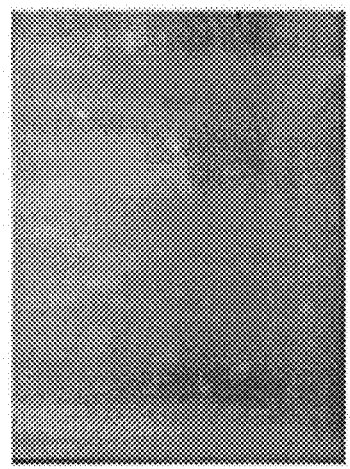

Thermal pastes generally have been known to degrade under thermal and mechanical cyclic loads by a variety of mechanisms, the most common being the growth and coalescence of entrapped air in the paste and the development of air-filled channels across the area of the paste. FIG. 1 illustrates these respective degradation mechanisms captured using IR thermography (see Feger et al., IBM Journal of Research and Development, Vol. 49, p. 699 (2005)). In particular, FIGS. 1A and 1B show IR images of the degradation of an exemplary paste via (a) growth and coalescence of entrapped air; and (b) development of air-filled channels. The exemplary paste includes aluminum and alumina particles incorporated in a hydrocarbon oil with a solids volume content greater than 72%. However, the illustrated degradation mechanism is common among many thermal pastes of different filler and binder chemistries.

Figure 2:
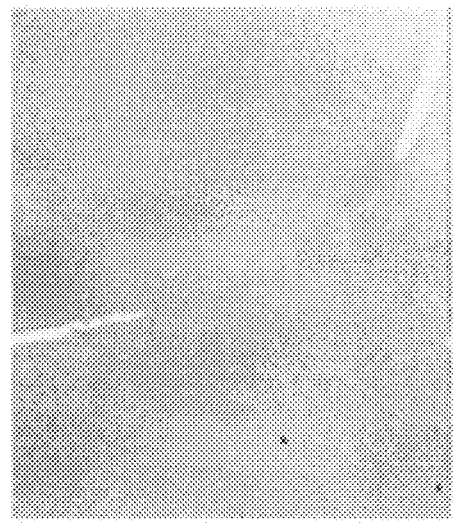
FIG. 2 shows an optical image showing air displacing the binder in an exemplary thermal paste.

Through recent experimental studies, it has been shown that the air channels materialize due to pre-existing drainage channels formed by the binder that arise along pseudo-grain boundaries in the paste. Air from the free edge of the paste or that which is entrapped in the paste displaces the binder in the channels, as illustrated in FIG. 2. For instance, FIG. 2 provides an optical image showing air displacing the binder in the exemplary paste.

In particular, FIG. 2 shows an optical image of air displacing the binder in the exemplary paste during heater power off. The air (seen as the bright yellow region) comes in from the edge (left side of image) and from local air pockets within the paste and displaces the binder that is tagged here using a soluble red dye (see red regions in channel). This displacement is typically observed during cooling of the cooling stack. The driving force is attributed to the negative pressure in the paste that results with the contraction of the confining interfaces and subsequent paste gap expansion.

In poorly dispersed pastes, it is observed that these channels develop during initial paste compression to a thin bondline and rapidly spread through the paste with cyclic thermal loading, suggesting that the channels occur along regions of inadequate dispersion or local heterogeneities in the paste, hereby referred to as pseudo-grain boundaries which are illustrated in FIG. 3.

Figure 3A:
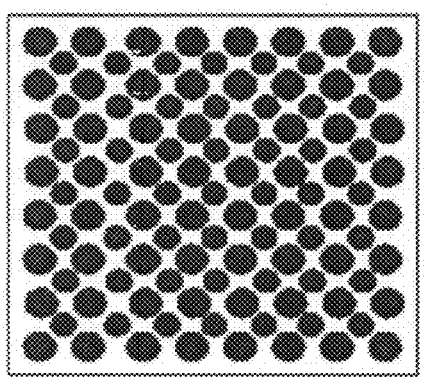
FIGS. 3A and 3B provide an illustration of a porous structure in:
(a) a homogeneous paste and
(b) a paste with local heterogeneities.
Figure 3B:
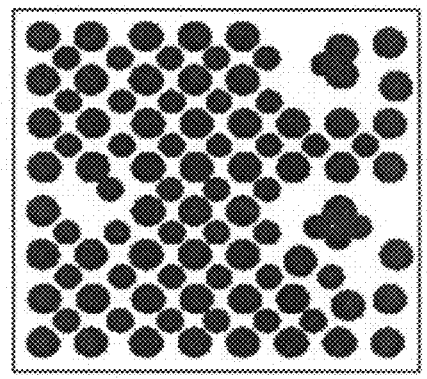

In particular, FIGS. 3A and 3B provide an illustration of a porous structure in: (a) a homogeneous paste and (b) a paste with local heterogeneities. The paste can be viewed as a porous medium containing a network of porous bodies (spherical pores) and throats (cylindrical pores) between the particles. Areas of local heterogeneities, e.g. due to agglomerates or aggregates in the paste result in pore bodies and throats of larger diameter near the heterogeneity. This is known as the "wall effect" and is well-documented in the cement paste literature, e.g., as described in Maso et. al, "The Bond Between Aggregates and Hydrated Cement Pastes," Proceedings 7th International Congress on the Chemistry of Cement, 3-15, 1980). This theory states that the porosity next to an aggregate or agglomerate is substantially larger than the average porosity of the porous medium and decreases to the average porosity with increasing distance from the aggregate. Larger porous spaces yield a lower pore pressure that favors fluid drainage from the paste in fractal channels similar to common drainage flow patterns through porous media.

Figure 4A:
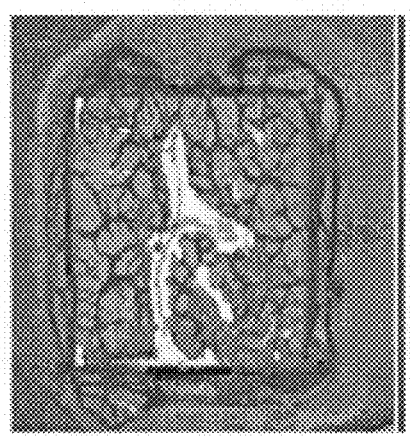
FIGS. 4A and 4B illustrate an actual field failure of a thermal paste that shows degradation of the paste due to a large.
Figure 4B:
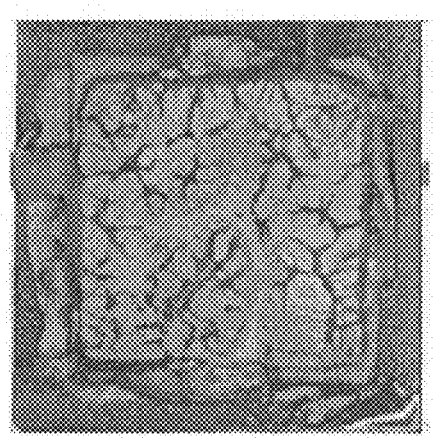

FIG. 4 illustrates structural degradation of the exemplary paste that failed reliability testing. The failure results from a network of air channels in the paste that negatively impacts its thermal conductivity. The left image (FIG. 4A) shows the remnants of the paste on the die surface, while the right image (FIG. 4B) shows the remnants of the paste on the heat spreader surface. Their structure is identical to the structure of fluid channels observed in poorly mixed pastes. A large air channel is observed in the image that spans parts of both the die and spreader interfaces and traces the structure of a crack in the paste on the die interface. This image supports the hypothesis that fluid drainage networks are the precursor to the air filled channels (by the mechanism of air displacement of the fluid).

Although the focus on paste degradation is usually centered around its impact to thermal management, it is important to note that such degradation mechanisms may also significantly affect the mechanical properties of the paste, particularly paste compliance, which is also important to the function of the paste as a TIM material as it is the basis for stress accommodation when thermal expansion mismatches exist in the system.

Referring back to FIG. 4, it is clear that these channels also develop in purportedly well-mixed pastes albeit slowly, and suggests that paste formulation using step batch mixing and shear processing does not provide optimal dispersion of paste components. The potential for combined distributive and dispersive mixing in extrusion processes allows for a finer scale of dispersion to be achieved in a single continuous mixing process.

Figure 5A:
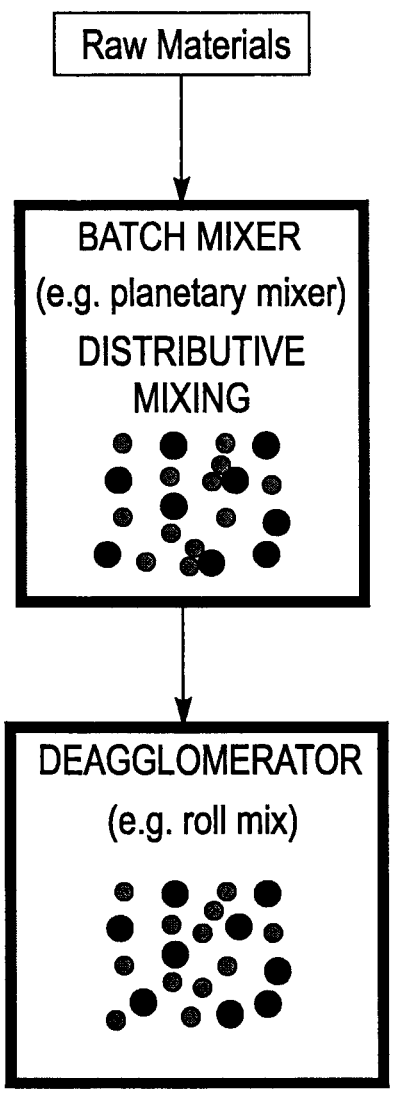
FIGS. 5A and 5B provide an illustration of comparative flowcharts of a formulation process for thermal paste and an extrusion formulation process.
Figure 5B:
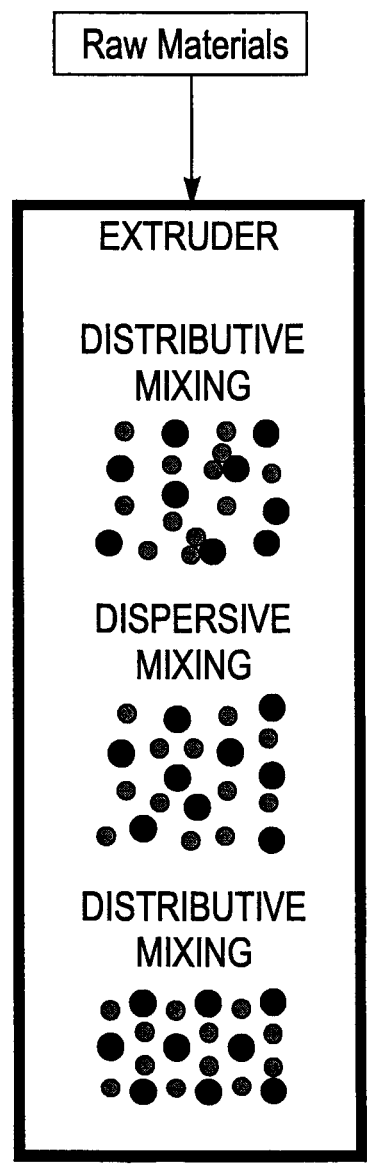

FIG. 5 shows a comparative flowchart of a general step batch process for paste formulation (FIG. 5A) and an optimized extrusion process (FIG. 5B). It can be seen that the extrusion process of FIG. 5B is more likely to yield a more finely dispersed paste that could minimize fluid drainage due to the elimination of large pore spaces that would otherwise favor fluid escape. Of course, it is well established that the efficiency of extrusion processing of a particular material is dependent on the screw configuration, be it a single or multi-screw extruder. With an effective screw or modular element design, dispersive and distributive mixing could be optimized for a particular thermal paste (see U.S. Pat. No. 5,932,159), leading to optimal dispersion of particles and binder in the paste.

Figure 6A:
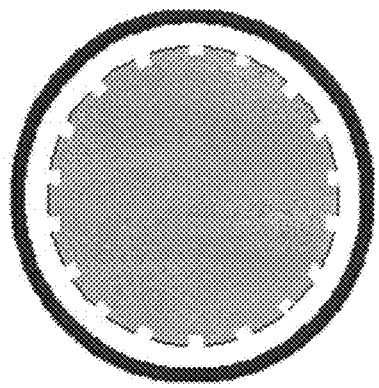
FIGS. 6A, 6B and 6C illustrate potential screw designs that may be used to achieve (a) dispersive mixing, (b) distributive mixing, or a (c) combination of the two in a single or multi-screw extruder.
Figure 6B:
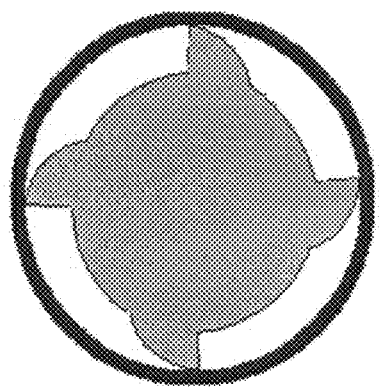
Figure 6C:
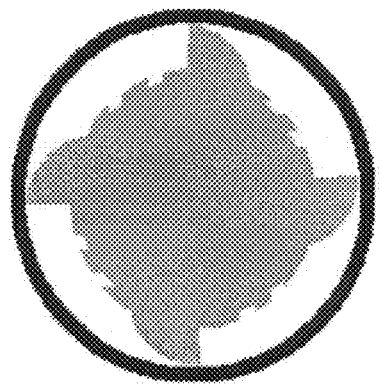

FIGS. 6A, 6B and 6C illustrate potential screw designs that may be used to achieve (a) dispersive mixing, (b) distributive mixing, or a (c) combination of the two in a single or multi-screw extruder. Examples of screw designs that can be used to achieve distributive mixing; dispersive mixing; or combined distributive and dispersive mixing, as further illustrated in U.S. Pat. No. 5,932,159. It is noted that the black outer ring is the inner wall of the barrel and the screw (be it integrated or modular), as shown in gray in FIGS. 6A, 6B and 6C.

To achieve distributive mixing, defined as mixing to optimize the spatial distribution of particles or uniformity of the composite where no solids breakdown is required, screw elements or screws are generally designed to perturb the velocity profiles in the channel. This can be achieved through channeled grooves or pins, or many other designs. To achieve dispersive mixing, defined as mixing in which solids breakdown is achieved with randomization of particle distribution, screw elements or screws are generally designed to introduce high shear and elongational stresses in the medium by forcing the medium to flow through constricted, non-parallel channels. A combination of dispersive and distributive mixing can also be achieved with an effective screw design.

These more rigorous and diverse mixing capabilities of the extruder make it ideal for optimal and consistent dispersion of paste components. However, the potential for entrapped air within the paste is equivalent, if not greater, with this mixing process. Therefore, another embodiment of the disclosure entails applying a vacuum in the extruder of a preferred range from about 0 to about −30 Hg, such that air present is removed from the paste during mixing.

One way of achieving this air removal would be to have a purely distributive mixing zone after the feed zone, in which a vacuum is pulled through the vent valve, and such that air coming in with the feed materials is removed in a relatively low pressure mixing zone. The de-aired moderately mixed compacted paste can then be conveyed to a more intense mixing zone consisting of elements that cause distributive and dispersive mixing. The finely dispersed paste is then conveyed to another less rigorous mixing zone, such as a kneading zone, where vacuum is again applied to remove remaining air in the paste before it is passed into the cooling zone and extruded through the die as a pre-form. It should be understood that one or more mixing zones at temperatures from about 40 to about 150° C. may be used in the extrusion process to optimize the mixing and de-airing of the thermal paste.

FIG. 7 shows flow chart diagrams of two potential methods of de-airing the pastes during the extrusion process. For instance, in FIG. 7A, the de-airing occurs during the distributive mixing in zones 1 and 2. In FIG. 7B, the de-airing occurs during the distributive and dispersive mixing in zone 1. However, it should be understood that these are not exclusive solutions and that other variations in the location of the vacuum application and/or mixing zones may achieve efficient de-airing. In addition, it is noted that the extruder mixed thermal paste may be directly extruded into a pre-form of appropriate thickness and shape using an appropriately designed die. One possibility to achieve this is by cooling the paste prior to extrusion through the die in a cooling zone, as shown in both diagrams of FIGS. 7A and 7B. In particular, pre-forms formed by direct extrusion eliminate pseudo-grain boundary formation and air voids that often arise during manual pre-form manufacture.

Incomplete paste spreading on the die or spreader interface using tube dispense methodology can also lead to pseudo-grain boundaries or air entrapment, as shown in FIG. 8B. This can be avoided if the de-aired, extrusion mixed paste is dispensed from a cartridge not in a discrete pattern (as the x pattern shown in FIG. 8A) but through a larger cartridge opening into a central blob often called a Hershey kiss. It is noted that the general dispense pattern used for tube dispensed thermal pastes (left image) can result in incomplete spreading resulting in voids (white regions in right image) or grain boundaries (shown in red in right image), as further described in Maso, J. C., "The Bond Between Aggregates and Hydrated Cement Pastes," Proceedings 7th International Congress on the Chemistry of Cement, 3-15, 1980.

Obviously, numerous modifications and variations of the disclosure are possible in light of the above disclosure. It is therefore understood that within the scope of the appended claims, the disclosure may be practiced otherwise than as specifically described herein.

What is claimed is:

1. A method of manufacturing a thermal paste, the method comprising:
    feeding the thermal paste into a chamber of an extruder;
    mixing the thermal paste;
    de-airing the thermal paste; and
    extruding the thermal paste out of the chamber through a die as a preform or into a cartridge,
    wherein air channels and pseudo-grain boundaries are prevented from forming in the thermal paste, and
    wherein the mixing is performed at a temperature ranging from about 40° C. to about 150° C.

2. The method according to claim 1, wherein the extruder is a single screw extruder.

3. The method according to claim 1, wherein the extruder is a multi-screw extruder.

4. The method according to claim 1, wherein the thermal paste is fed into the extruder as a pre-mixed composite.

5. The method according to claim 1, wherein raw material components of the thermal paste are separately fed into the extruder.

6. The method according to claim 1, wherein the mixing is performed while applying vacuum ranging from about 0 to about −30 Hg.

7. The method according to claim 1, wherein the mixing comprises dispersive mixing.

8. The method according to claim 1, wherein the mixing comprises distributive mixing.

9. The method according to claim 1, wherein the mixing comprises dispersive and distributive mixing.

10. The method according to claim 1, wherein the temperature is maintained throughout the entire chamber of the extruder or at specific zones in the extruder.

11. The method according to claim 1, wherein the vacuum is maintained throughout the entire chamber of the extruder or at specific zones in the extruder.

12. The method according to claim 1, wherein the thermal paste is cooled prior to extruding through the die of the extruder.

13. The method according to claim 12, wherein the thermal paste is cooled in a second zone of the chamber to a temperature from about 0° C. to about 25° C.

14. The method according to claim 13, wherein the thermal paste has a solids loading of greater than 65% v/v.

15. The method according to claim 1, wherein the paste comprises metal or metal oxide particles and an organic binder.

16. A method of manufacturing a thermal paste, the method comprising:
    feeding the thermal paste into a chamber of an extruder;
    heating the thermal paste to a temperature from about 40° C. to about 150° C. in one or more zones of the chamber;
    dispersive mixing the thermal paste while applying vacuum in a first zone of the chamber;
    dispersive and distributive mixing the thermal paste in a second zone of the chamber;
    distributive mixing the thermal paste in a third zone of the chamber;
    cooling the thermal paste in a fourth zone of the chamber; and
    extruding the thermal paste out of the extruder through a die as a pre-form or into a cartridge,
    wherein air channels and pseudo-grain boundaries are prevented from forming in the thermal paste.

17. The method according to claim 16, wherein the extruder is a single screw extruder.

18. The method according to claim 16, wherein the extruder is a multi-screw extruder.

19. A method of manufacturing a thermal paste, the method comprising:
    feeding the thermal paste into a chamber of an extruder;
    heating the thermal paste to a temperature from about 40° C. to about 150° C. in one or more zones of the chamber;
    dispersive and distributive mixing the thermal paste while applying vacuum in a first zone of the chamber;
    cooling the thermal paste in a second zone of the chamber; and
    extruding the thermal paste out of the extruder through a die as a pre-form or into a cartridge,
    wherein air channels and pseudo-grain boundaries are prevented from forming in the thermal paste.

20. The method according to claim 19, wherein the extruder is a single screw extruder.

21. The method according to claim 19, wherein the extruder is a multi-screw extruder.

22. The method according to claim 19, wherein the thermal paste is cooled in a second zone of the chamber to a temperature from about 0° C. to about 25° C.

23. The method according to claim 22, wherein the thermal paste has a solids loading of greater than 65% v/v.

* * * * *